United States Patent
Inoue et al.

(10) Patent No.: US 7,623,379 B2
(45) Date of Patent: Nov. 24, 2009

(54) SEMICONDUCTOR INTEGRATED CIRCUIT DEVICE AND NON-VOLATILE MEMORY SYSTEM USING THE SAME

(75) Inventors: Atsushi Inoue, Tokyo (JP); Yoshihisa Sugiura, Kamakura (JP); Tatsuya Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 234 days.

(21) Appl. No.: 11/685,391

(22) Filed: Mar. 13, 2007

(65) Prior Publication Data

US 2007/0153582 A1    Jul. 5, 2007

Related U.S. Application Data

(63) Continuation of application No. 11/097,300, filed on Apr. 4, 2005, now Pat. No. 7,203,091.

(30) Foreign Application Priority Data

Nov. 5, 2004   (JP) .............................. 2004-322496

(51) Int. Cl.
    *G11C 11/34* (2006.01)
(52) U.S. Cl. .............................. 365/185.09; 365/185.24
(58) Field of Classification Search ............ 365/185.09, 365/185.24
    See application file for complete search history.

(56) References Cited

U.S. PATENT DOCUMENTS

| 5,954,828 | A | 9/1999 | Lin |
|---|---|---|---|
| 6,185,134 | B1 | 2/2001 | Tanaka et al. |
| 6,549,459 | B2 | 4/2003 | Higuchi |
| 6,657,896 | B2 | 12/2003 | Hosono et al. |
| 6,859,401 | B2 | 2/2005 | Hosono et al. |
| 6,903,981 | B2 * | 6/2005 | Futatsuyama et al. .. 365/185.33 |
| 7,434,111 | B2 * | 10/2008 | Sugiura et al. ................ 714/48 |
| 2003/0195714 | A1 * | 10/2003 | Jeddeloh ...................... 702/107 |
| 2003/0204743 | A1 * | 10/2003 | Devadas et al. ............. 713/200 |
| 2005/0286308 | A1 | 12/2005 | Nagashima |
| 2006/0050564 | A1 | 3/2006 | Kojima et al. |
| 2006/0117214 | A1 | 6/2006 | Sugiura et al. |
| 2006/0156192 | A1 | 7/2006 | Nakamura et al. |
| 2006/0171202 | A1 | 8/2006 | Kawamoto et al. |
| 2006/0245259 | A1 | 11/2006 | Fukuda et al. |

FOREIGN PATENT DOCUMENTS

| JP | 3-125399 | 5/1991 |
|---|---|---|
| JP | 6-28899 | 2/1994 |
| JP | 6-76586 | 3/1994 |
| JP | 10-222995 | 8/1998 |
| JP | 3178912 | 4/2001 |

* cited by examiner

*Primary Examiner*—Michael T Tran
(74) *Attorney, Agent, or Firm*—Oblon, Spivak, McClelland, Maier & Neustadt, L.L.P.

(57) ABSTRACT

A semiconductor integrated circuit device includes a non-volatile memory having a pseudo pass function of returning a pass as a status even if a bit error reaching an allowable number of bits occurs after at least one of write or erase sequence is completed. The non-volatile memory includes an issue timing control section for controlling timing of issuing the pseudo pass function.

20 Claims, 12 Drawing Sheets

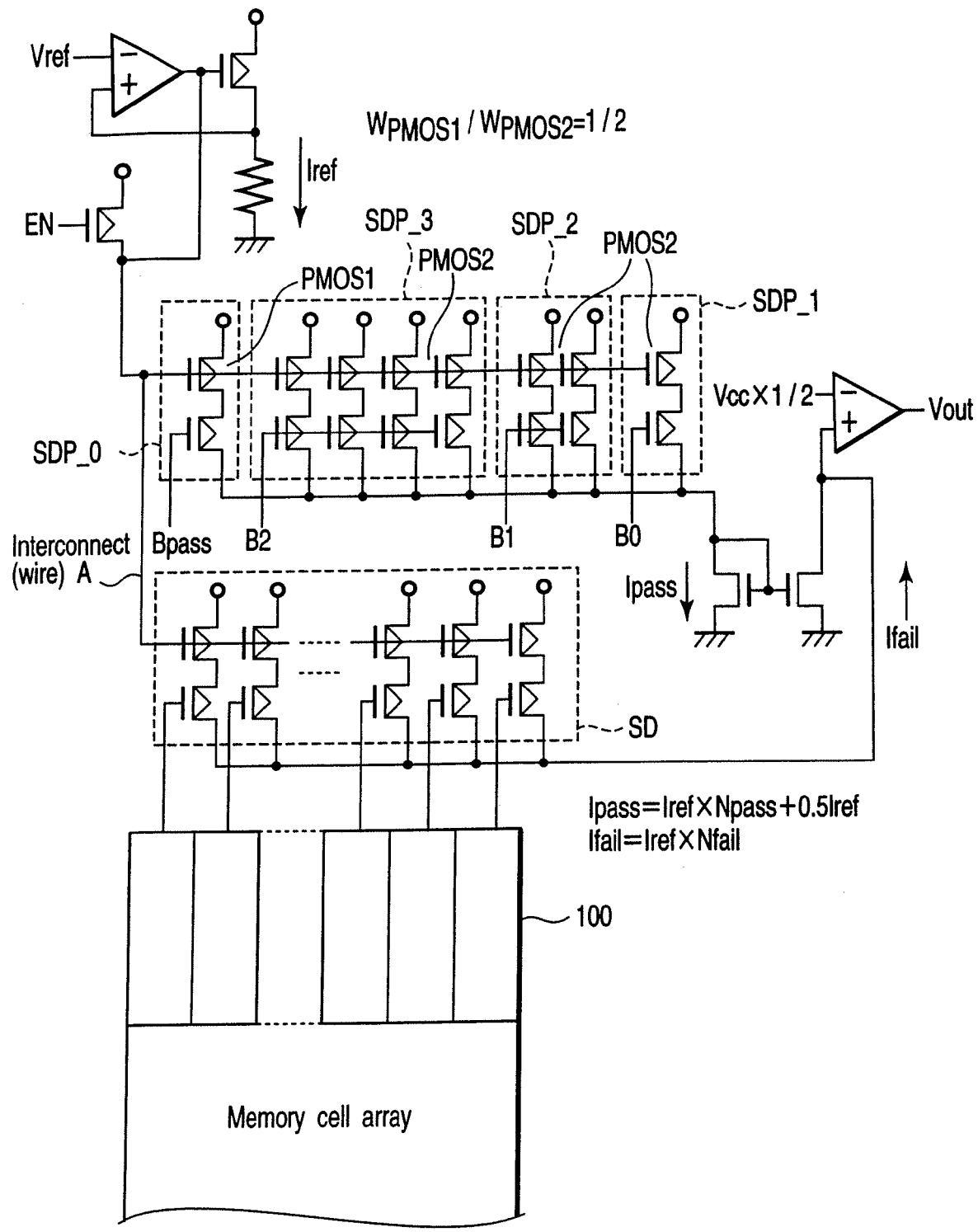
F I G. 1

Internal waveform in the case where the number of bit errors occurring in one page is two bits.

*: optional

Set NF<0:3> to "1111"
Set Max Loop to OFC<0:3> < "1111"

| | OFC<0> | NF<0> | COMP<0> | OFC<1> | NF<1> | COMP<1> | OFC<2> | NF<2> | COMP<2> | OFC<3> | NF<3> | COMP<3> | SET | RST | PFLG |
|---|---|---|---|---|---|---|---|---|---|---|---|---|---|---|---|
| Count ↓ | 0 | 1 | 1 | 0 | 1 | 1 | 0 | 1 | 1 | 0 | 1 | 1 | 0 | 0 | 0 |
| | 0 | 1 | 1 | 0 | 1 | 1 | 0 | 1 | 1 | 1 | 1 | 0 | 0 | 0 | 0 |
| | 0 | 1 | 1 | 0 | 1 | 1 | 1 | 1 | 0 | 0 | 1 | 1 | 0 | 0 | 0 |
| | 0 | 1 | 1 | 0 | 1 | 1 | 1 | 1 | 0 | 1 | 1 | 0 | 0 | 0 | 0 |
| | 0 | 1 | 1 | 1 | 1 | 0 | 0 | 1 | 1 | 0 | 1 | 1 | 0 | 0 | 0 |
| | 0 | 1 | 1 | 1 | 1 | 0 | 0 | 1 | 1 | 1 | 1 | 0 | 0 | 0 | 0 |
| | 0 | 1 | 1 | 1 | 1 | 0 | 1 | 1 | 0 | 0 | 1 | 1 | 0 | 0 | 0 |
| | 0 | 1 | 1 | 1 | 1 | 0 | 1 | 1 | 0 | 1 | 1 | 0 | 0 | 0 | 0 |
| | 1 | 1 | 0 | 0 | 1 | 1 | 0 | 1 | 1 | 0 | 1 | 1 | 0 | 0 | 0 |
| Max Loop → | 1 | 1 | 0 | 1 | 1 | 0 | 1 | 1 | 0 | 0 | 1 | 1 | 0 | 0 | 0 |
| ← Set | 1 | 1 | 0 | 1 | 1 | 0 | 1 | 1 | 0 | 1 | 1 | 0 | 1 | 0 | 1 |
| ← Reset | * | * | * | * | * | * | * | * | * | * | * | * | 0 | 1 | 0 |

*: optional

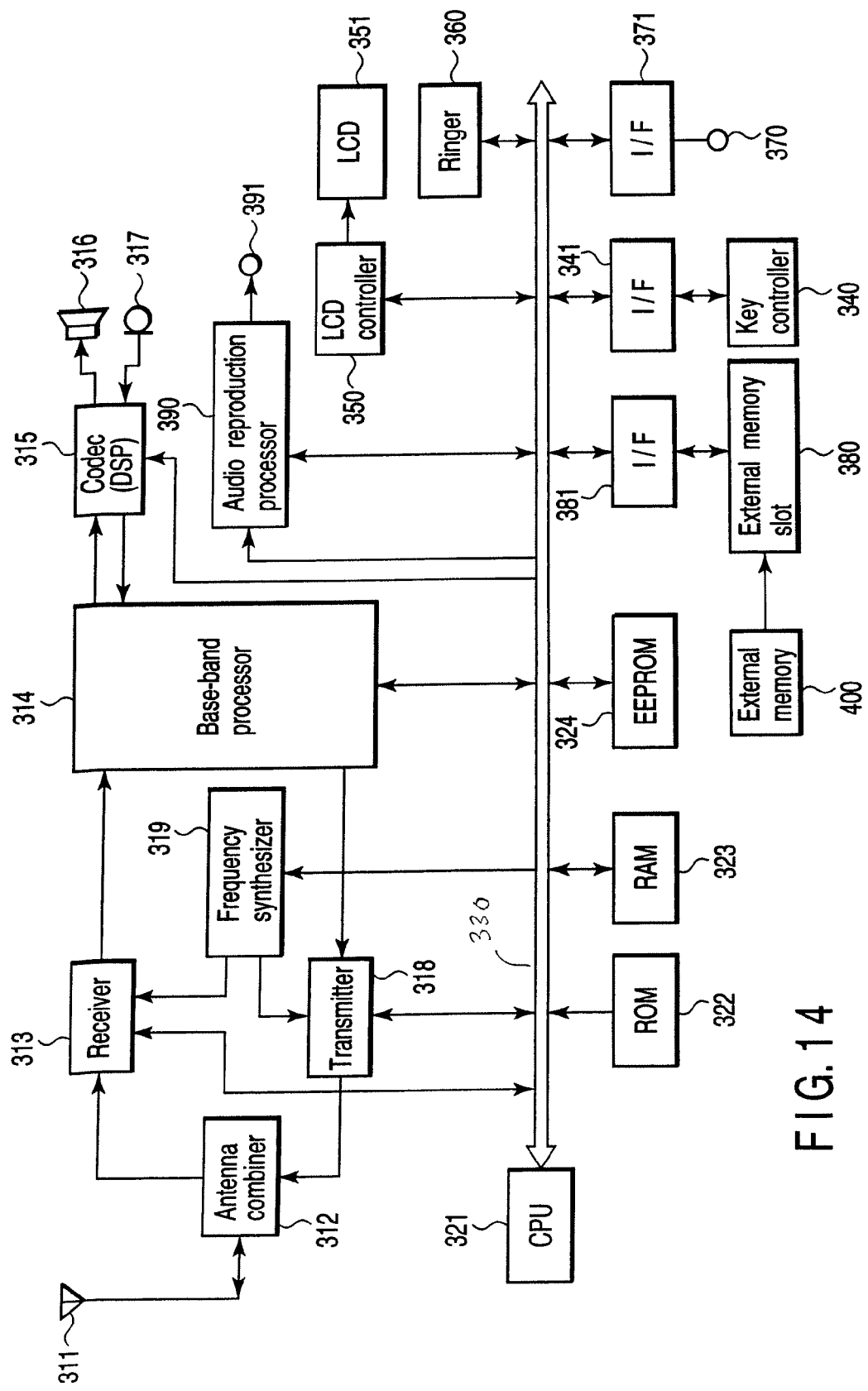
F I G. 14

US 7,623,379 B2

SEMICONDUCTOR INTEGRATED CIRCUIT DEVICE AND NON-VOLATILE MEMORY SYSTEM USING THE SAME

CROSS-REFERENCE TO RELATED APPLICATIONS

This application is a continuation application of U.S. Ser. No. 11/097,300, filed Apr. 4, 2005, now allowed, and claims the benefit of priority from prior Japanese Patent Application No. 2004-322496, filed Nov. 5, 2004, the entire contents of which are incorporated herein by reference.

BACKGROUND OF THE INVENTION

1. Field of the Invention

The present invention relates to a semiconductor integrated circuit device. In particular, the present invention relates to a semiconductor integrated circuit device including a non-volatile memory system having a pseudo pass function.

2. Description of the Related Art

If a non-volatile semiconductor memory device, for example, NAND flash memory is used, bit error detection and correction by ECC (Error Checking and Correcting) are effective for ensuring sufficient reliability. For example, a standard system using a multi-value NAND flash memory has a built-in ECC, which enables four-symbol bit error detection and correction per page.

High integration and large capacity have advanced in the NAND flash memory. In such a NAND flash memory having high integration and large capacity, the following phenomenon has been recently reconfirmed. According to the phenomenon, the threshold value of a certain memory cell suddenly becomes high; as a result, data is not correctly written or erased. This phenomenon is called "sudden bit error" in the following description.

In view of the foregoing circumstances, the following concept has been known. For example, in the multi-value NAND flash memory, it is advantageous in terms of cost to allow the "sudden bit error" to some degree, to ensure reliability. A function developed based on the foregoing concept is a so-called "pseudo pass function". The "pseudo pass function" is a method of returning a "pass" as the status even if a bit error occurs in one or two bits when chip internal write or erase sequence is completed. For example, the foregoing method has been disclosed in U.S. Pat. No. 6,185,134 and Japan Patent Registration No. 3178912. More specifically, even if the bit error occurs when chip internal write or erase sequence is completed, ECC is carried out in a system or flash controller in the read operation. For this reason, no hindrance arises so long as the bit error is within a range of the number of correctable bits.

However, the mechanism is such that the foregoing "pseudo pass function" is issued after write or erase pulse is applied by a predetermined number of times. For this reason, the following problem arises. In order to carry out write or erase with respect to pages or blocks having bits incapable of permanently writing or erasing, a pulse is applied by a predetermined number of times. For this reason, a write or erase speed is reduced; as a result, this is a factor leading to reduction in the performance of an electronic apparatus system using a NAND flash memory, for example, a memory card.

BRIEF SUMMARY OF THE INVENTION

According to a first aspect of the present invention, there is provided a semiconductor integrated circuit device comprising:

a non-volatile memory having a pseudo pass function of returning a pass as a status even if a bit error reaching an allowable number of bits occurs after at least one of write or erase sequence is completed, the non-volatile memory including an issue timing control section for controlling timing of issuing the pseudo pass function.

According to a second aspect of the present invention, there is provided a non-volatile memory system comprising:

a non-volatile memory; and a memory controller controlling the non-volatile memory, the non-volatile memory having:

a pseudo pass function of returning a pass as a status even if a bit error reaching an allowable number of bits occurs after at least one of write or erase sequence is completed; and, an issue timing control section for controlling timing of issuing the pseudo pass function, the memory controller having:

an issue timing change function changing timing of issuing the pseudo pass function.

BRIEF DESCRIPTION OF THE SEVERAL VIEWS OF THE DRAWING

FIG. 1 is a circuit diagram showing the configuration of a pseudo pass-enabled data register;

FIG. 14 is a block diagram showing the system configuration of a mobile phone;

DETAILED DESCRIPTION OF THE INVENTION

Figure 2:
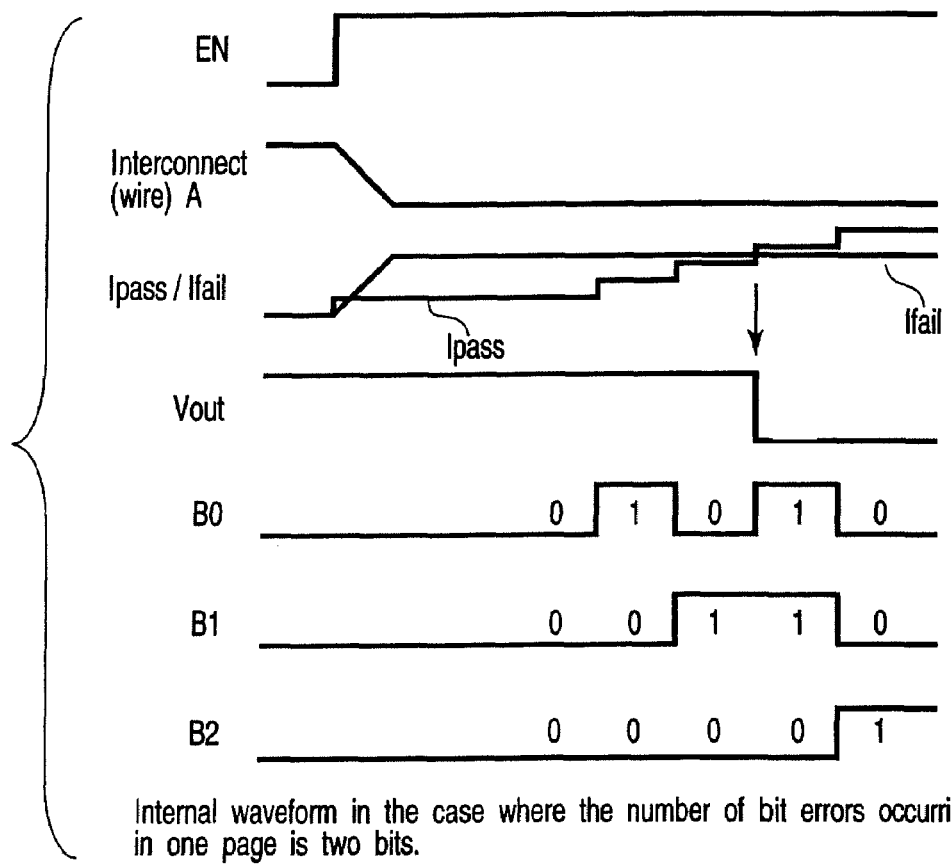
FIG. 2 is a waveform chart showing internal waveforms of the pseudo pass-enabled data register.

Addresses in which the foregoing "sudden bit error" occurs are random, and the cause has no relation with the operational history. However, the "sudden bit error" possibly is related to the aging degradation of memory cell. Even if the "sudden bit error" occurs, data is erased, and thereafter, the data is again written, and thereby, recovery is made. Judging from the peculiarity described above, a "sudden bit error" is not a phenomenon resulting from the fatal failure of the memory cell, but is considered as a soft error fault. There exists no way to effectively prevent the "sudden bit error" at present.

The "sudden bit error" occurs in non-volatile semiconductor memory devices using the same non-volatile memory cell as NAND flash memories, regardless of the type of NAND flash memory. There is a possibility that a serious problem arises in a multi-value memory having a data corresponding threshold distribution range more severe than a normal two-value memory.

In the NAND flash memory, a write or erase pulse is applied to a memory cell, and thereafter, the state of the memory cell is automatically verified, and thereby, it is determined whether or not write or erase is completed. However, if there exists a bit in which write or erase is not completed, a write or erase pulse is again applied, and then, verify is again made. The operation described above is repeated by a predetermined number of times (Max loop) set in the NAND flash memory.

In this memory the "pseudo pass function" is issued after a write or erase pulse is applied by a predetermined number of times. For this reason, the following problem arises. When write or erase is carried out with respect to a page or block having a bit incapable of permanently writing or erasing, a pulse is applied by a predetermined number of times. For this reason, a write or erase speed is reduced; as a result, this is a factor leading to reduction in the performance of an electronic apparatus system using a NAND flash memory, for example, a memory card.

Embodiments of the present invention will be described below with reference to the accompanying drawings. In the following description, the same reference numerals are used to designate identical portions over all drawings.

FIRST EMBODIMENT

FIG. 1 shows the configuration of a pseudo pass-enabled data register used for a NAND flash memory having a "pseudo pass function".

The pseudo pass-enabled data register has a register (page buffer) 100 storing data equivalent to one page. The data register makes a wired OR connection for one byte in order to collectively detect the verify result, and inputs it to each gate of a PMOS included in a SD (simultaneous detection) circuit. The PMOS of the SD circuit carries a current Ifail proportional to the number of bits if a bit having an incomplete write exists in the page buffer. A signal Bpass is applied to the gate of the lower PMOS in circuit SDP_0, a signal B0 is applied to the gate of the lower PMOS in circuit SDP_1, a signal B1 is applied to the gates of the lower two PMOS in circuit SDP_2 and signal B2 is applied to the gates of the four lower PMOS in circuit SDP_3. Connected to the SD circuit is a circuit including a differential amplifier, resistor and a PMOS transistor. A voltage Vref is applied to the inverting input of the amplifier and a signal EN is applied to the gate of the PMOS transistor. A current Iref flows through the resistor. Interconnect wire A is connected between circuits SD and SDP_0.

The current Ifail is compared with a current Ipass of circuits SDP_0, SDP_1, SDP_2 and SDP_3, and thereby, it is possible to detect the number of bits having incomplete verify. A voltage Vout is produced by an amplifier having an inverting input to which Vcc×½ is applied and a non-inverting input connected to one of the pair of transistors to which Ipass and Ifail are introduced. The circuit SDP_0 is a system for making a detection that write of all bits included in the page is completed. In this case, the gate width of a PMOS1 included in the circuit SDP_0 is set to a half of each PMOS2 included in circuits SDP_1 to circuit SDP_3. Thus, it is possible to securely make a detection that write is completed, regardless of variations in the transistor.

In FIG. 2, there are shown internal waveforms when the data register shown in FIG. 1 detects the number of allowed bits. FIG. 2 shows internal waveforms of the data register in the case where a bit error occurring in one page is two bits.

Conventionally, the timing of issuing the pseudo pass function is fixed after the predetermined number of times (Max loop), and there exists no circuit for controlling the issue timing. The issue timing is intactly fixed after the predetermined number of times, and thereby, the following problem arises. When write or erase is carried out with respect to a page or block having a bit incapable of permanently writing or erasing, a pulse is applied for the predetermined number of times. For this reason, a write or erase speed is reduced; as a result, this is a factor leading to reduction in the performance of an electronic apparatus system using a NAND flash memory, for example, a memory card.

In order to solve the foregoing problem, according to the first embodiment, the NAND flash memory is provided with a circuit for controlling the issue timing. By doing so, maker and user sides can control and change the timing of issuing the pseudo pass function. The issue timing control/change function of the first embodiment will be described below. In the following description, a non-volatile memory system controlling a non-volatile memory using a memory controller is given as one example.

Figure 3:
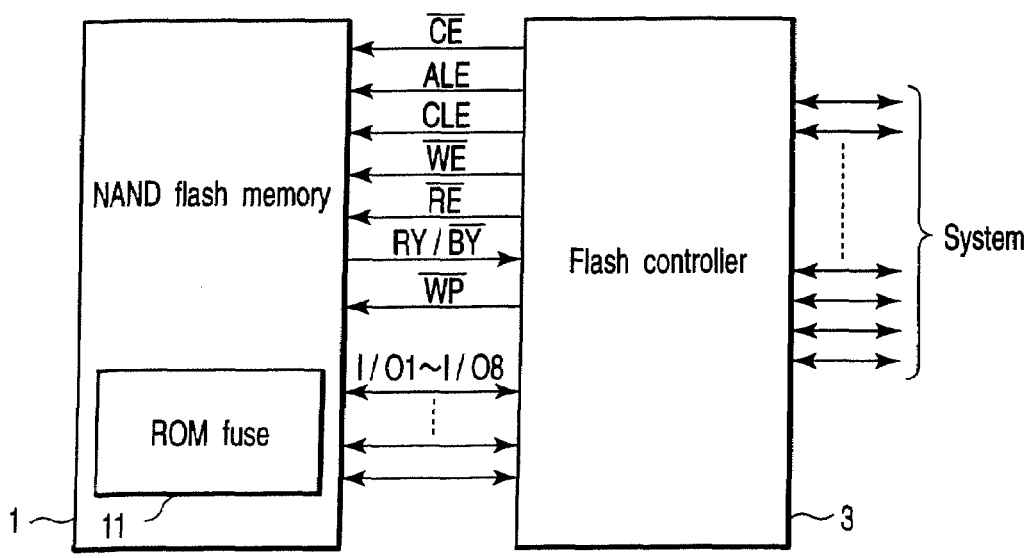
FIG. 3 is a block diagram showing the configuration of a non-volatile memory system using a semiconductor integrated circuit device according to a first embodiment of the present invention.

FIG. 3 is a block diagram showing the configuration of a non-volatile memory system using a semiconductor integrated circuit device according to a first embodiment of the present invention. In this embodiment, a NAND flash memory is used as a non-volatile memory, and a flash controller is used as the memory controller.

As shown in FIG. 3, a flash controller 3 controls a NAND flash memory 1. For example, the controller 3 makes access to the memory 1 according to a request from an external host, and controls data read, data write and data erase. The memory 1 has a control pin and input/output pin. The control pin is basically used for receiving control signals from the controller 3. The input/output pin is basically used for making a data exchange with the controller 3, receiving commands from the controller 3 and transmitting status information to the controller 3. In the first embodiment, /CE (chip enable), ALE (address latch enable), CLE (command latch enable) /WE (write enable), /RE (read enable), RY/BY (ready/busy) and /WP (write protect) are given as the control pin. I/O1 to I/O8 are given as the input/output pin. The foregoing control pin and input/output pin are connected to the controller 3.

Figure 4:
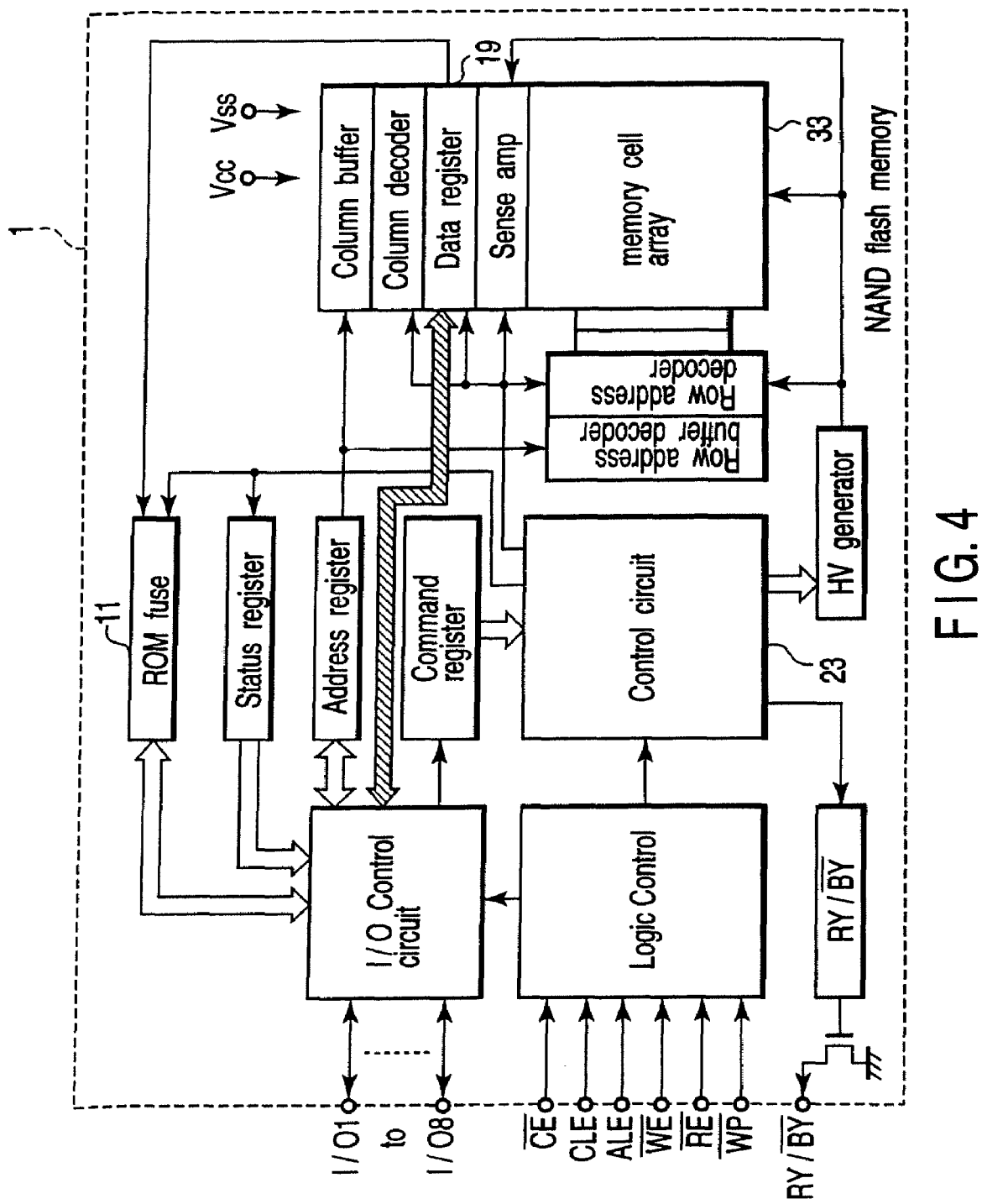
FIG. 4 is a block diagram showing the configuration of the semiconductor integrated circuit device according to the first embodiment of the present invention.

FIG. 4 shows the configuration of the memory 1. The circuit block shown in FIG. 4 will be described below together with the operation.

Figure 5:
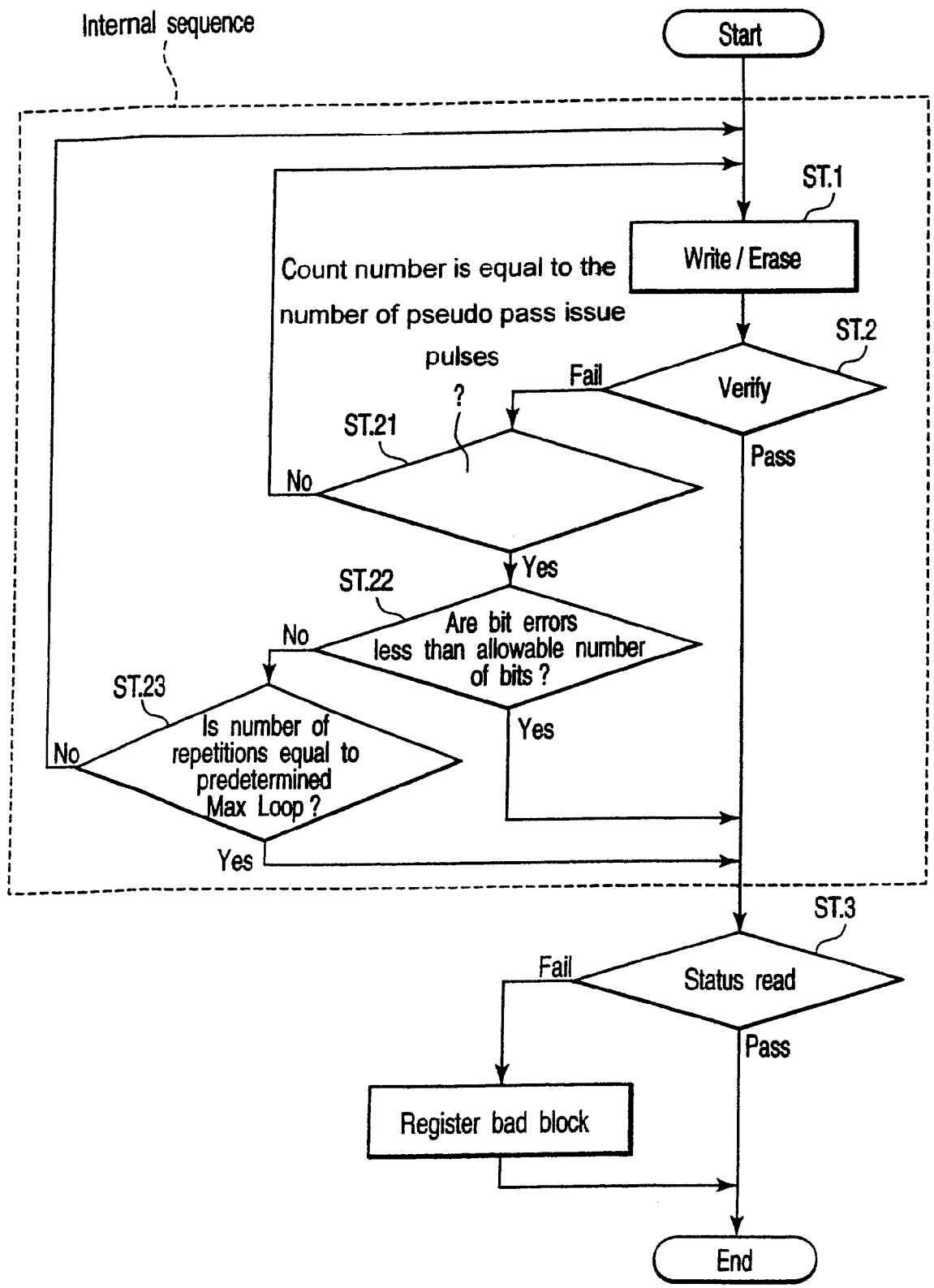
FIG. 5 is a flowchart to explain a write sequence of the semiconductor integrated circuit device according to the first embodiment of the present invention.

FIG. 5 is a flowchart to explain the write or erase sequence of the semiconductor integrated circuit device according to the first embodiment of the present invention, for example, a NAND flash memory.

In the NAND flash memory, write or erase and verify are automatically repeated. When the write or erase is completed, the RY/BY pin returns to the ready state, and thus, the input of a status read command is possible. If there exists a bit in which write or erase is not completed, write or erase and verify are repeated by the predetermined number of times (Max Loop) set in the NAND flash memory. In this case, the following mechanism is given in the first embodiment. According to the mechanism, the pseudo pass function is issued in all program or erase pulses after a count of application times of program or erase pulse of the NAND flash memory equals the number of pseudo pass issue pulses of issuing the pseudo pass function.

As shown in FIG. 5, the controller 3 issues a write or erase command according to a request from the system. When receiving the write or erase command, the memory 1 automatically repeats a write-verify sequence (internal sequence). More specifically, in step ST. 1, write or erase is carried out with respect to a page or block of the memory cell array. Thereafter, in step ST. 2, verify is carried out, If "Pass" is given in step ST. 2, the internal sequence ends, and then, the flow transfers to status read in step ST. 3. On the other hand, if "Fail" is given, the internal sequence is continued. According to the first embodiment, it is determined in step ST. 21 whether or not the count number of program/erase pulse applications equals the number of pseudo pass issue pulses.

If the count number does not equal the number of pseudo pass issue pulses in step ST. 21 (No), the flow returns to step ST. 1, and then, write or erase is again carried out. On the other hand, if the count number equals the number of pseudo pass issue pulses (Yes), the flow transfers to step ST. 22. It is determined in step ST. 22 whether or not the number of bit errors is less than the allowable number of bits allowed as pseudo pass.

If it is determined in step ST. 22 that the number of bit errors is less than the allowable number of bits (Yes), the pseudo pass function is issued, and then, the internal sequence ends. Thereafter, the flow transfers to status read of step ST. 3. On the other hand, if it is determined that the number of bit errors exceeds the allowable number of bits (No), the flow transfers to step ST. 23. It is determined in step ST. 23 whether or not the number of repetitions reaches a predetermined number of times (Max Loop).

In step ST. 23, if the number of repetitions reaches the predetermined number of times (Max Loop) (Yes), the internal sequence ends, and then the flow transfers to the status read of step ST. 23. On the other hand, if the number of repetitions does not reach the predetermined number of times (Max Loop) (No), the flow returns to step ST. 1. Thereafter, write or erase is again carried out.

In the status read of ST. 3, the controller 3 issues a status read command to the memory 1. When receiving the status read command, the memory 1 returns a status of "Pass" or "Fail" to the controller 3. The status read is carried out; as a result, if "Pass" is given as the status, the write or erase sequence intactly ends. If "Fail" is given as the status, the block in which write or erase is carried out is registered as a bad block, and thereafter, the write or erase sequence ends. The use of the block registered as a bad block is inhibited after that.

Figure 6:
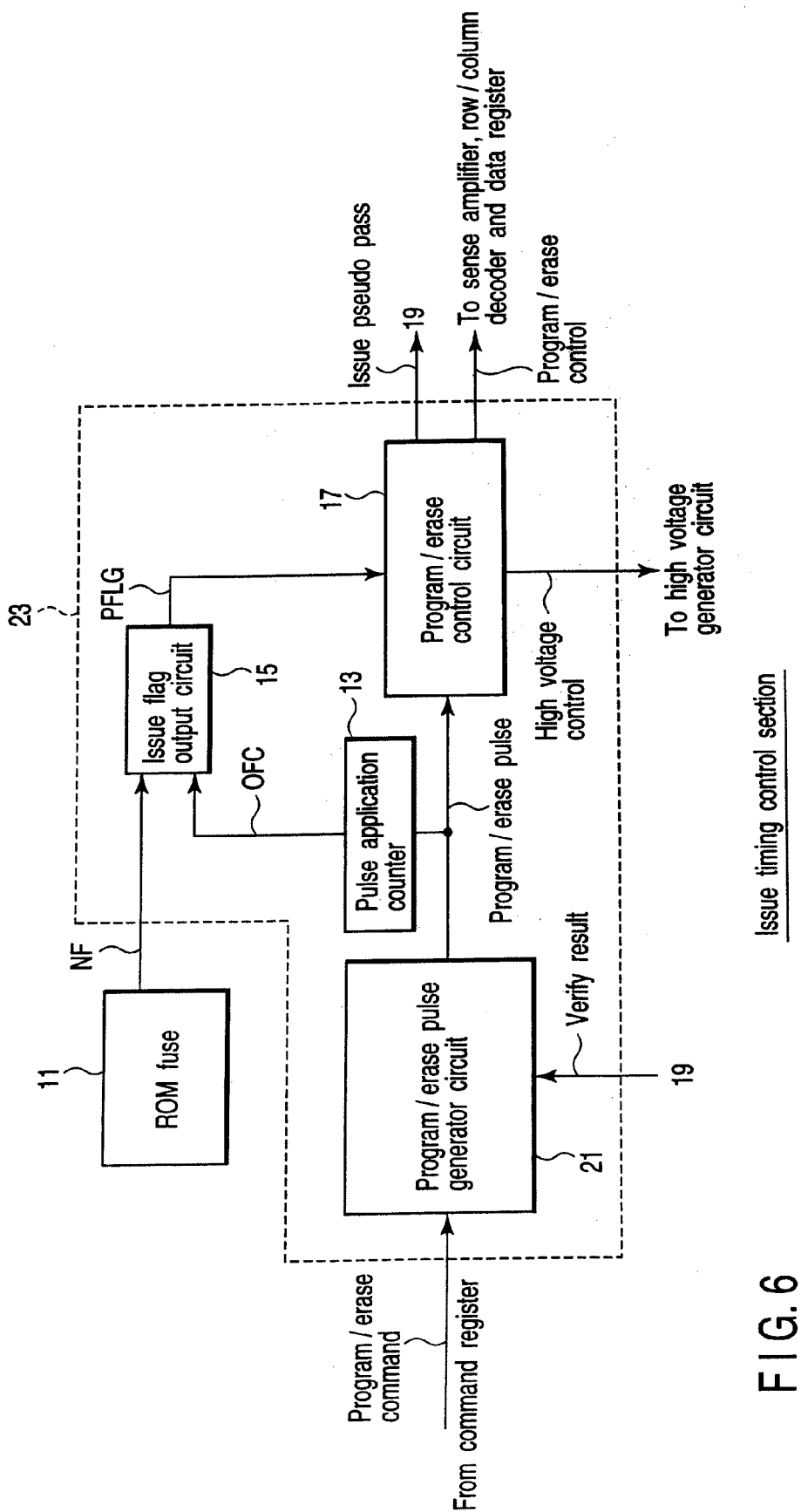
FIG. 6 is a block diagram showing the configuration of an issue timing control section included in the semiconductor integrated circuit device according to the first embodiment of the present invention.

In the sequence shown in FIG. 5, the pseudo pass function is issued before pulse application reaches the predetermined number of times (Max Loop). In particular, the pseudo pass function is issued according to the procedure of ST. 21 and ST. 22 in the sequence shown in FIG. 5. In order to issue the pseudo pass function before pulse application reaches the predetermined number of times (Max Loop), the memory 1 of the first embodiment has an issue timing control section. FIG. 6 shows the configuration of the issue timing control section.

As seen from FIG. 6, the issue timing control section of this embodiment includes a pseudo pass issue pulse storage section, pulse application count section and issue flag output section.

The pseudo pass issue pulse storage section stores the number of pulses for issuing the pseudo pass function. In the first embodiment, the foregoing section is equivalent to a ROM fuse 11. A pseudo pass issue pulse frequency is written in the ROM fuse 11, and is outputted to the issue flag output section as an output NF.

The pulse application count section counts the number of program or erase pulse application times. In the first embodiment, the foregoing section is equivalent to a pulse application counter 13. The counter 13 increments the count number every time the program or erase pulse is applied. The count number is outputted to the issue flag output section as an output OFC.

The issue flag output section takes the procedure shown in step ST. 21, and outputs a pseudo pass issue flag PFLG if the number of pulses written in the ROM fuse 11 coincides with the count number of the counter 13. In the first embodiment, the foregoing section is equivalent to an issue flag output circuit 15. The flag PFLG is inputted to a program/erase control circuit 17. The control circuit 17 outputs a pseudo pass issue signal according to the flag PFLG. The pseudo pass issue signal is inputted to a data register 19 (see FIG. 1 and FIG. 4). When receiving the pseudo pass issue signal, the data register 19 takes the procedure shown in step ST. 22 to determine whether or not the number of bit errors is less than the allowable number of bits allowed as pseudo pass. If the number of bit errors is less than the allowable number of bits, the verify result showing the determination described above is returned to a program/erase pulse generator circuit 21. Then, the internal sequence ends. On the other hand, if the number of bit errors exceeds the allowable number of bits, the verify result showing the determination described above is returned to the generator circuit 21. In this case, the generator circuit 21 takes the procedure shown in step ST. 23. If pulse application reaches the predetermined number of times (Max Loop), the internal sequence ends. Conversely, if the pulse application does not reach the predetermined number of times (Max Loop), the generator circuit 21 outputs program/erase pulse again.

In the issue timing control section, circuits other than the ROM fuse 11 are included in a control circuit 23 of the memory 1 having the configuration shown in FIG. 4.

The circuit configuration of the issue flag output circuit 15 is described below.

Figures 7, 8:
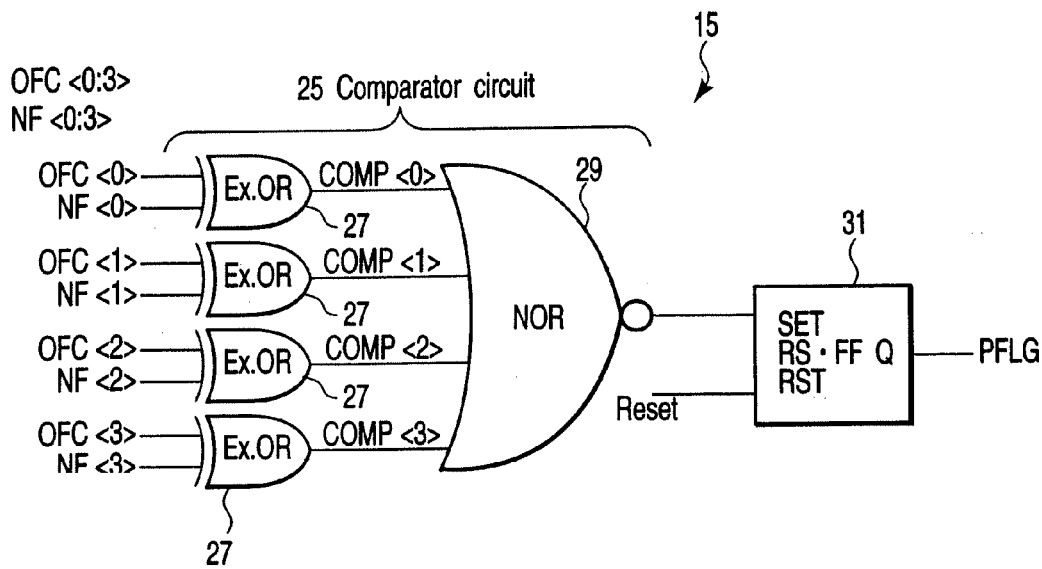
FIG. 7 is a circuit diagram showing the configuration of an issue flag output circuit shown in FIG. 6.
FIG. 8 is a view to explain the logic of issue flag output circuit shown in FIG. 7.

FIG. 7 is a circuit diagram showing the configuration of the issue flag output circuit 15.

In the circuit shown in FIG. 7, the number of pseudo pass issue pulses is expressed by a NF<0:3> four-bit signal. Likewise, the count number is expressed by OFC<0:3> four-bit signal (NF and OFC are not limited to four bits). The output circuit 15 includes a comparator circuit 25, which makes a comparison between these four-bit signals. The comparator circuit 25 is basically a logic gate circuit, which can make detection that the number of pseudo pass issue pulses NF coincides with the count number OFC.

In the first embodiment, the output circuit 15 is provided with a logic gate circuit, that is, exclusive OR gate circuit (Ex. OR) 27 in order to detect the coincidence of NF and OFC. The exclusive OR gate circuit (Ex. OR) 27 compares NF with OFC every bit, and detects coincidence/non-coincidence. The Ex. OR gate circuit 27 compares NF with OFC every bit, and sets the output to "0" when NF and OFC makes coincidence in "1" or "0". In the first embodiment, the output circuit 15 is further provided with a logic gate circuit, that is, NOR (inverted logical sum) gate circuit 29. The NOR gate circuit 29 makes detection that the comparison result COMP<0:3> for every bit becomes "1" or "0". The NOR gate circuit 29 sets the output to "1" only when the comparison result of every bit becomes "0". The output of the NOR gate circuit 29 is inputted to a set input SET of a RS-FF (Reset/Set-Flip-Flop) circuit 31. The RS-FF circuit 31 is set when the set input SET becomes "1", and keeps the output Q until Reset "1" is inputted to a reset input RST. The output Q is a flag PFLG, and after "1" flag PFLG is outputted; pseudo pass is given after program/erase pulse is applied.

FIG. 8 is a view to explain the logic of the output circuit 15 shown in FIG. 7. According to the logic, the number of pseudo pass issue pulses NF<0:3> is set to "0100". As described in FIG. 7, if the number of pseudo pass issue pulses NF<0:3> is set to "0100", the set input SET becomes "1" only when the count number OFC<0:3> coincides with "0100". Thus, the RS-FF circuit 31 is set; therefore, the flag PFLG is on ("1").

Although not illustrated in particular, even if the number of pseudo pass issue pulses NF<0:3> is set to four bits other than "0100", the set input SET becomes "1", though naturally, only when the count number OFC<0:3> coincides with NF<0:3>.

One example of the status output will be described below.

Figures 9, 10:
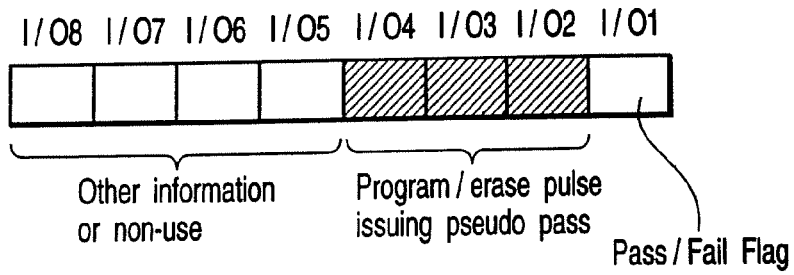
FIG. 9 is a view to explain a status output.
FIG. 10 is a view to explain another logic of issue flag output circuit shown in FIG. 7.

When the number of pseudo pass issue pulses NF coincides with the count number PFC, the pseudo pass function is issued. After the internal sequence ends, the memory 1 returns the status output in accordance with the number of allowable bits or the number of allowable bytes. FIG. 9 shows one example of the status output. The least significant bit I/O1 shows "Pass"/"Fail". For example, if the output value is "0", "Pass" is given as the status; on the other hand, if it is "1", "Fail" is given as the status. If the status is "Pass", the number of pseudo pass issue pulses is outputted to I/O2 to I/O4 as binary. By doing so, the number of program/erase pulses issuing pseudo pass is confirmed. The output method is not limited to the above; and a bit assign may be changed, or a command different from the status command showing "Pass"/"Fail" may be assigned.

Even if the number of program/erase pulses for issuing a pseudo pass becomes the final pulse (reaches the predetermined number of times Max Loop), there is no need of changing the pseudo pass issue timing so long as the target performance is maintained. However, if it is impossible to satisfy the target performance, the pseudo pass issue timing must be changed. In this case, the pseudo pass issue timing is changed in a manner of making access to the memory 1 from the flash controller 3 (memory controller) to rewrite the number of pseudo pass issue pulses.

The number of pseudo pass issue pulses is stored in the ROM fuse 11 shown in FIG. 4. The ROM fuse 11 is formed using a memory cell having the same structure as the memory cells integrated on the memory cell array 33 shown in FIG. 4. In order to rewrite the number of pulses stored in the ROM fuse 11, addressing is carried out to designate the ROM fuse 11. The data stored in the ROM fuse 11 is rewritable in the same manner as data stored in a normal memory cell. The ROM fuse 11 is an area for storing the operation information of the memory, for example, redundancy information. The memory 1 has a test code command for rewriting information stored in the ROM fuse 11. Using the test code command, the system side such as the flash controller 3 issues a ROM fuse rewrite command to rewrite the data. Thus, the value stored in the ROM fuse 11 is reflected from the next write/erase; therefore, the number of pseudo pass issue program/erase pulses is changed.

In the semiconductor integrated circuit device of the first embodiment, the pseudo pass issue timing is freely set after an arbitrary number of times, although it is conventionally fixed after the predetermined number of times (Max Loop). The user can freely set the pseudo pass issue timing after the device delivery. Therefore, it is possible to prevent the reduction of the performance of electronic apparatus system, for example, memory card.

According to the first embodiment, the user or maker can freely select whether or not the pseudo pass function is used. If the user or maker selects not to use the pseudo pass function, the issue flag output circuit 15 shown in FIG. 6 may be set so that the flag PFLG is not on. In the issue flag output circuit 15 shown in FIG. 7, the number of issue pulses NF may be set to a value, which the count number OFC does not reach, using the advantage that the number of issue pulses NF is arbitrarily changed. By doing so, the flag PFLG is not on. For example, as depicted in FIG. 10, the number of issue pulses NF<0:3> is set to "1111". The predetermined number of times (Max Loop) is set so that OFC<0:3> becomes less than "1111". By doing so, OFC<0:3> does not take the value "1111". Therefore, the flag PFLG is not on until the predetermined number of times (Max Loop). In other words, the pseudo pass function is not issued. As described above, it is possible in the first embodiment to freely select whether or not the pseudo pass function is used.

If the maker intends to use the pseudo pass function after delivery, the pseudo pass function is issued when a certain program or erase pulse is given in the delivery test. By doing so, the time spent for the delivery test is shortened as compared with the case where the pseudo pass function is issued after the predetermined number of times (Max Loop).

In the delivery test, the following setting is made. That is, the program or erase pulse is applied for the predetermined number of times (Max Loop), and blocks including bits having no write or erase are registered as bad blocks in accordance with the functions currently demanded on the market. One demand is for the pseudo pass function to be issued after the pulse is applied by the predetermined number of times (Max Loop). Another is the case where the pseudo pass function is not quite issued. However, the first embodiment is adaptable to the foregoing both cases because the pseudo pass issue timing can be varied, and the issuance of the pseudo pass function can be denied. Therefore, the manufacturing cost is reasonable in view of the advantages described above.

SECOND EMBODIMENT

According to the first embodiment, the number of issue pulses NF is stored in the ROM fuse 11. The number of issue pulses NF may be stored in forms other than the ROM fuse 11. The second embodiment relates to one example of storing the number of issue pulses NF in forms other than the ROM fuse 11.

Figure 11:
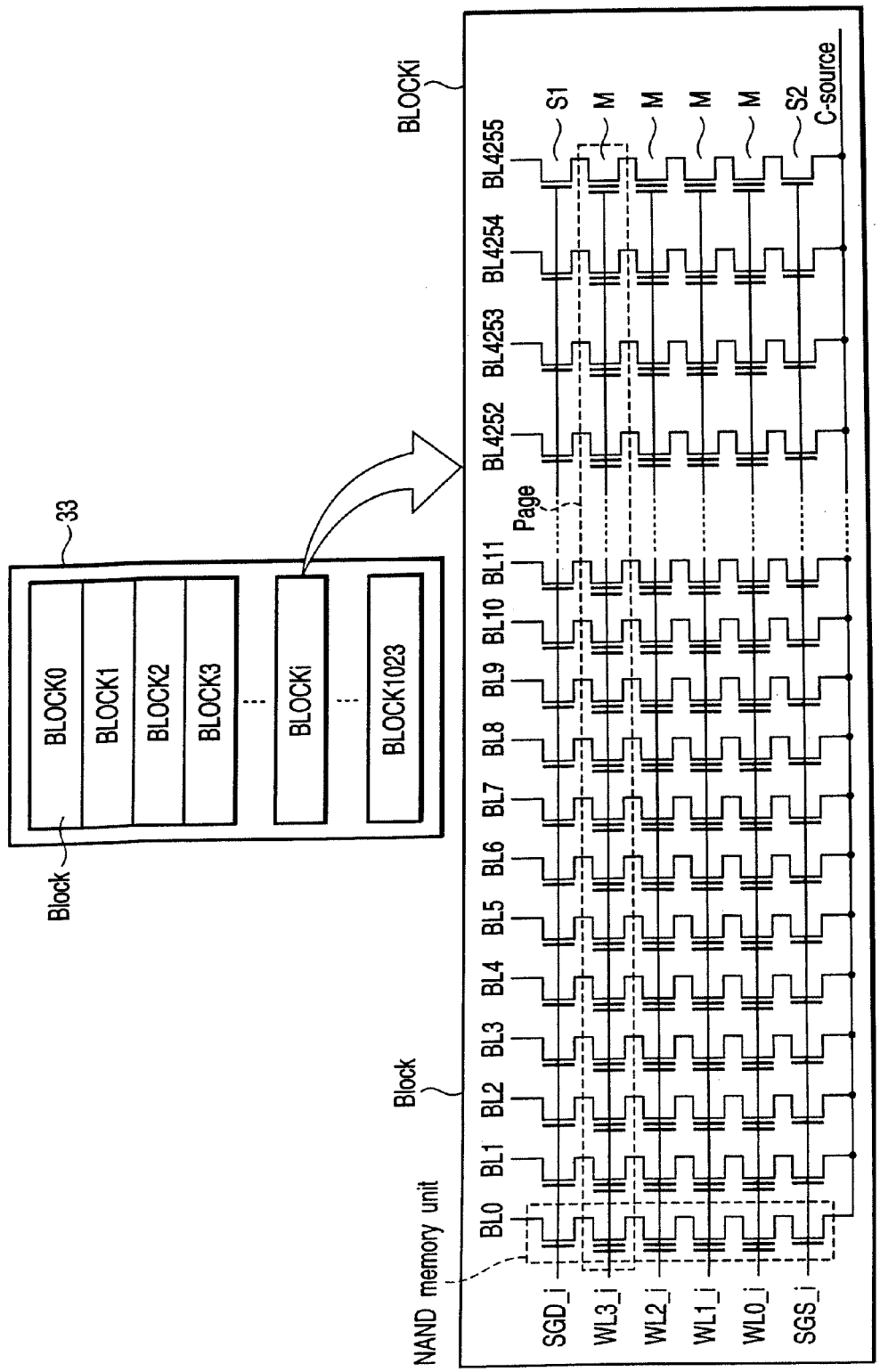
FIG. 11 is a view to explain the relationship between block and page.

According to the second embodiment, the number of issue pulses NF is stored in a part of a page of a block. FIG. 11 is a view to explain the relationship between a block and page.

As illustrated in FIG. 11, the memory cell array 33 includes 1024 blocks BLOCK0 to BLOCK1023. The block is used as the smallest unit for erase. One block BLOCK includes 4256 NAND memory units. The NAND memory unit includes series-connected several non-volatile semiconductor memory cell transistors M, for example, four memory cell transistors M. The NAND memory unit further includes a select gate transistor S1 connected to one terminal of series-connected four memory cell transistors M, and a select gate transistor S2 connected to the other terminal thereof. The gate of the select gate transistor S1 is connected to a drain select gate line SGD, and the current path is connected in series between memory cell transistors M and a bit line BL. The gate of the select gate transistor S2 is connected to a source select gate line SGS, and the current path is connected in series between memory cell transistors M and a cell source line C-source. The gates of four memory cell transistors M are connected respectively to word lines WL0 to WL3. Data write and read are concurrently carried out with respect to 4256 memory cell transistors M connected to one word line WL. Thus, one-bit data or multi-bit data stored in one memory cell transistor M is collected, and therefore, 4256 bits of data forms a page in the second embodiment. One page is used as the smallest unit for write and read.

Figure 12:
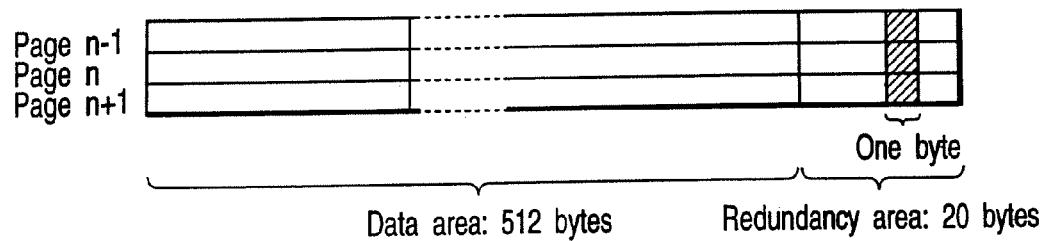
FIG. 12 is a view showing one example of a page.

FIG. 12 shows one example of a page. According to the third embodiment, the page size is 532 bytes, for example. In the second embodiment, 532 bytes are allocated in a manner that 512 bytes are allocated to a data area, and the remaining 20 bytes are allocated to a redundancy area. The data area is used as main memory storage used by the system, and the redundancy area is used as storage for redundancy and other information. According to the second embodiment, the number of issue pulses NF is stored using a partial area of the page, for example, some of the memory cell transistors M of the redundancy area. An area storing the number of issue pulses NF is a part of the 20-byte redundancy area, for example, one byte.

APPLICATION EXAMPLE

Electronic appliances using the semiconductor integrated circuit device according to the present invention or the non-volatile memory system using the same device will be described below.

Figure 13:
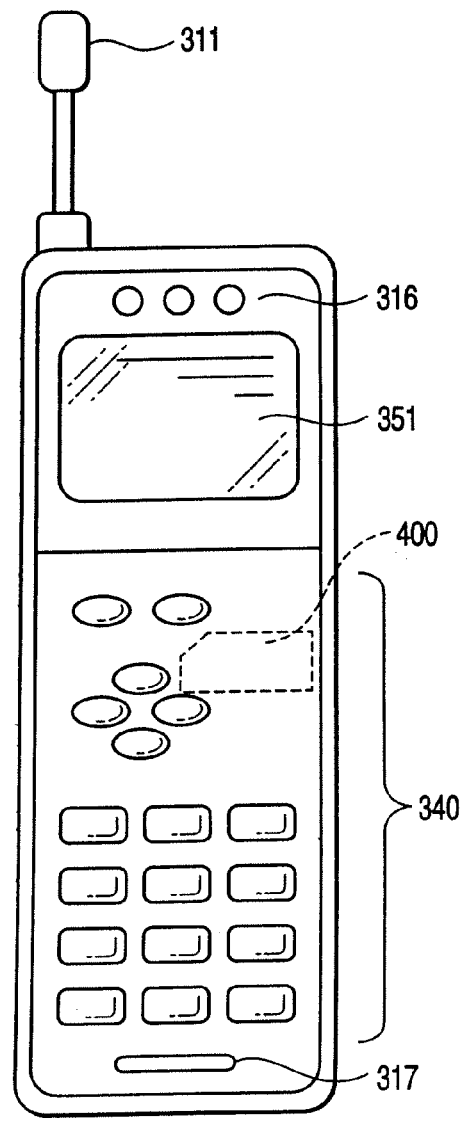
FIG. 13 is a view showing an electronic appliance to which the semiconductor integrated circuit device according to the present invention, or the non-volatile memory system using the same device is applied.

FIG. 13 shows one example of an electronic appliance using the non-volatile memory system according to the present invention. In FIG. 13, there is shown a portable electronic appliance, for example, mobile phone as one example of electronic appliances.

The foregoing embodiments relate to the non-volatile memory system; for example, the non-volatile memory system is applicable to a rewritable ROM (EEPROM) of a mobile phone. Naturally, the non-volatile memory system is also applicable to a ROM of a mobile phone, in addition to an EEPROM.

FIG. 14 is a block diagram showing the system configuration of a mobile phone. The mobile phone will be explained below with reference to the system configuration.

As shown in FIG. 13 and FIG. 14, the mobile phone includes a communication section and control section. The communication section includes a transmitting/receiving antenna 311, antenna combiner 312, receiver 313 and baseband processor 314. The communication section further includes DSP (Digital Signal Processor) 315 used as voice codec, speaker 316, microphone 317, transmitter 318 and frequency synthesizer 319.

The control section includes CPU 321, and ROM 322, RAM 323 and EEPROM 324, which are connected to the CPU 321 via CPU bus 330. The ROM 322 stores programs executed by the CPU 321, for example, necessary data such as communication protocols and display fonts. The RAM 323 is mainly used as a work area. For example, the RAM 323 stores computation data in executing programs by the CPU 321 as the need arises, or temporarily stores data exchanged between the control section and other sections. The rewritable ROM (EEPROM) 324 is a non-volatile memory system, and data stored therein is not lost even if the mobile phone is powered off. Thus, if the user decides to store preceding setting conditions and to make the same settings in the next power-on, the EEPROM 324 stores parameters for the foregoing setting. The non-volatile memory system of the foregoing embodiments is applicable to the EEPROM 324. Naturally, the non-volatile memory system is applicable to the ROM 322.

The mobile phone further includes key controller 340, LCD controller 350, ringer 360, external input/output terminal 370, external memory slot 380 and audio reproduction processor 390.

The key controller 340 is connected to the CPU bus 330 via interface circuit (I/F) 341. Key input information inputted from the key controller 340 is given to the CPU 321.

The LCD controller 350 receives display information from the CPU 321 via the CPU bus 330, and converts it into LCD control information for controlling a LCD (Liquid Crystal Display) 351, and thereafter, gives it to the LCD 351

The ringer 360 generates a ring tone.

The external input/output terminal 370 is connected to the CPU bus 330 via an interface circuit 371. The external input/output terminal 370 functions as a terminal for inputting information to the mobile phone from outside and outputting it to the outside from the mobile phone.

An external memory 400, such as a memory card, is inserted into the external memory slot 380. The external memory slot 380 is connected to the CPU bus 330 via an interface circuit 381. The mobile phone is provided with the slot 380, and thereby, the following function is obtained. In brief, information from the mobile phone is written in the external memory, and information stored in the external memory 400 is read, and thereafter, inputted to the mobile phone.

The external memory 400 is a memory card, for example. The memory card has a non-volatile memory system as storage section. The non-volatile memory system of the foregoing embodiments is usable as the storage section of the memory card.

The audio reproduction processor 390 reproduces audio information inputted to the mobile phone or audio information stored in the external memory 400. The reproduced audio information is delivered to headphones or a portable speaker via an external terminal 391. For example, the mobile phone is provided with the audio reproduction processor 390, and thereby, audio information is reproducible.

As is evident from the foregoing description, the non-volatile memory system of the present invention is applicable to a mobile phone and a memory card.

Figure 15A:
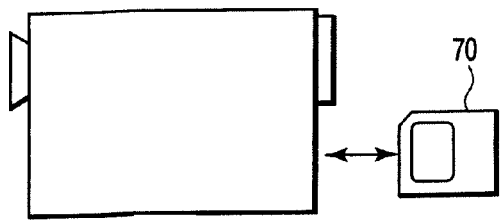
FIGS. 15A to 15F are views showing electronic appliances using a memory card to which the semiconductor integrated circuit device according to the present invention, or the non-volatile memory system using the same device is applied.
Figure 15B:
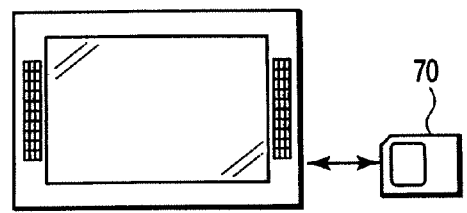
Figure 15C:
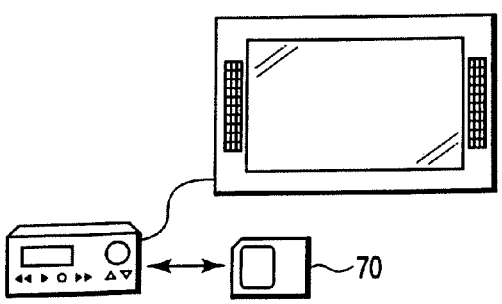
Figure 15D:
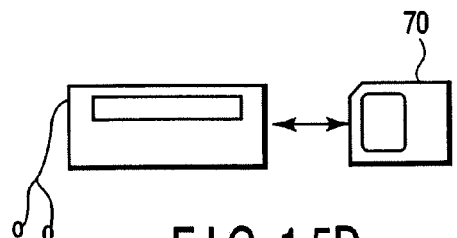
Figure 15E:
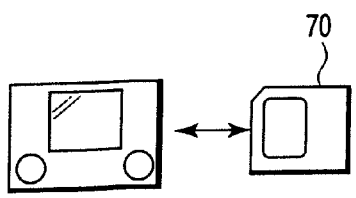
Figure 15F:
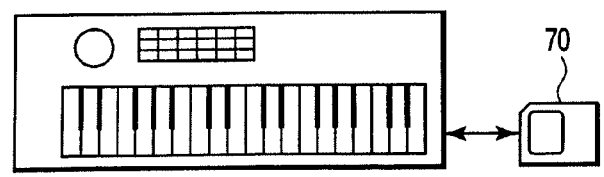
Figure 16A:
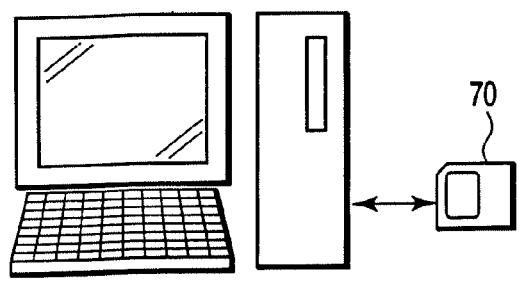
FIGS. 16A to 16E are views showing electronic appliances using a memory card to which the semiconductor integrated circuit device according to the present invention, or the non-volatile memory system using the same device is applied.
Figure 16B:
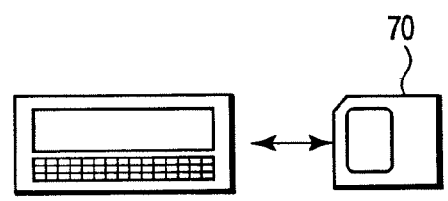
Figure 16C:
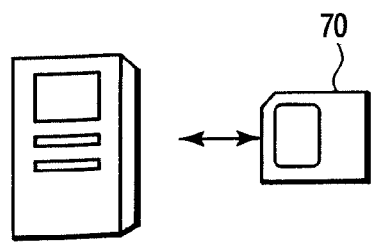
Figure 16D:
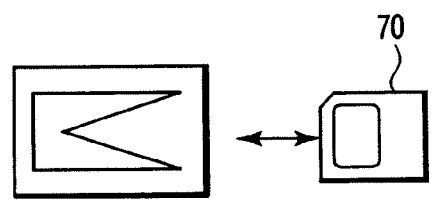
Figure 16E:
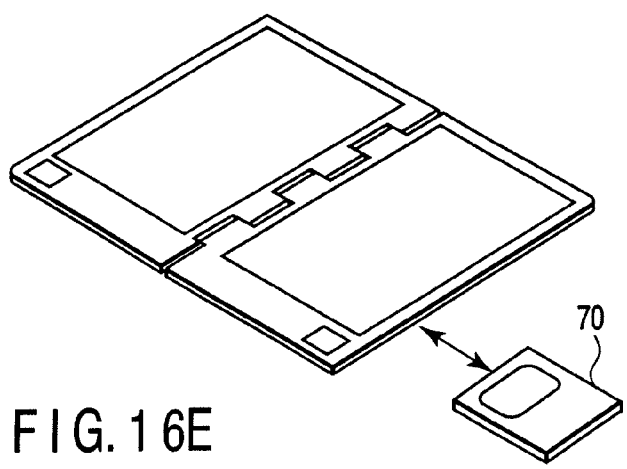

The memory card using the non-volatile memory system of the present invention is applicable as recording media of electronic appliances shown in FIGS. 15A to 15F and FIGS. 16A to 16E. The electronic appliances include a digital still camera/video camera (FIG. 15A), television (FIG. 15B), audio/visual apparatus (FIG. 15C), audio apparatus (FIG. 15D), game machine (FIG. 15E) and electronic musical instrument (FIG. 15F). The electronic appliances further include a personal computer (FIG. 16A), personal digital assistant (PDA) (FIG. 16B), voice recorder (FIG. 16C), PC card (FIG. 16D) and electronic book terminal (FIG. 16E).

The present invention has been described using several embodiments and is not limited to these embodiments. Various modifications may be made without diverging from the subject matter of the invention.

A binary memory or multi-value memory may be given as the memory 1. The NAND flash memory is given as one example of the memory 1; in this case, the memory 1 is not limited to the NAND flash memory.

The foregoing embodiments are solely carried out; however, these embodiments may be carried out in combination with each other.

The foregoing embodiments each include various inventive steps, and several constituent requirements shown in each embodiment may be otherwise combined to extract various inventive steps.

The foregoing embodiments have explained about the example in which the present invention is applied to a non-volatile memory and a non-volatile memory system using the non-volatile memory. The present invention is not limited to the foregoing non-volatile memory and memory system and is applicable to a non-volatile memory or semiconductor integrated circuit device including a non-volatile memory system using a non-volatile memory, for example, a processor and system LSI. In addition, the present invention is applicable to an electronic appliance system using including a non-volatile memory system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A data writing method of a memory system including a memory controller and a non-volatile semiconductor memory being controlled by the memory controller and including a memory cell array, the data writing method comprising:
   (A) issuing a writing command by the memory controller;
   (B) receiving the writing command by the memory;
   (C) applying a writing pulse and writing data to a plurality of memory cells of the memory cell array by the memory;
   (D) verifying the data written into the plurality of memory cells;
   (E) returning a pass to the memory controller as a status by the memory if the verification passes;
   (F) determining whether or not the number of times of applying the writing pulse is equal to the number of pseudo pass issuing pulses if the verification fails;
   (G) repeating (C) to (F) if the number of times of applying the writing pulse is not equal to the number of pseudo pass issuing pulses;
   (H) determining whether or not the number of bit errors is equal to or less than a permissible bit number if the number of times of applying the writing pulse is equal to the number of pseudo pass issuing pulses;
   (I) returning a pass to the memory controller as a status by the memory if the number of bit errors is equal to or less than the permissible bit number;
   (J) determining whether or not the number of times of applying the writing pulse reaches a predetermined number if the number of bit errors exceeds the permissible bit number;
   (K) repeating (C) to (J) if the number of times of applying the writing pulse is equal to or less than the predetermined number; and
   (L) returning a fail to the memory controller as a status by the memory if the number of times of applying the writing pulse exceeds the predetermined number.

2. The data writing method according to claim 1, wherein the number of the pseudo pass issuing pulse is written in a storage unit of the memory.

3. The data writing method according to claim 2, wherein when the number of the pseudo pass issuing pulses written in the storage unit is rewritten, the memory controller issues a rewriting command.

4. The data writing method according to claim 2, wherein the storage unit is a ROM fuse provided out of the memory cell array.

5. The data writing method according to claim 4, wherein the ROM fuse includes a memory cell having a same structure as the memory cells in the memory cell array.

6. The data writing method according to claim 2, wherein the storage unit is provided in the memory cell array.

7. The data writing method according to claim 6, wherein the storage unit is provided within a page in the memory cell array.

8. The data writing method according to claim 7, wherein the storage unit is provided out of a data area of the page.

9. The data writing method according to claim 1, wherein the non-volatile semiconductor memory is a multi-value memory.

10. The data writing method according to claim 1, wherein the non-volatile semiconductor memory is a NAND flash memory.

11. The data writing method according to claim 9, wherein the multi-value memory is a NAND flash memory.

12. The data writing method according to claim 1, wherein when the memory controller issues a status read command, and the non-volatile semiconductor memory receives the status read command, the non-volatile semiconductor memory returns the status to the memory controller.

13. The data writing method according to claim 1, wherein if the status is a fail, a use of a plurality of memory cells in which the data is written is inhibited.

14. A memory controller which controls a non-volatile semiconductor memory including a memory cell array and a memory in which a number of pseudo pass issue pulses is written, the memory controller comprising:
   a function of issuing a writing command to cause data to be written into a plurality of memory cells in the memory cell array; and
   a function of issuing a rewriting command to rewrite the number of pseudo pass issuing pulses which is written in the memory.

15. The memory controller according to claim 14, further comprising a function of issuing a status request command and returning a status from the non-volatile semiconductor memory.

16. The memory controller according to claim 14, wherein the non-volatile semiconductor memory is accessed in accordance with a request from an external host.

17. The memory controller according to claim 14, wherein the non-volatile semiconductor memory is a multi-value memory, and the memory controller controls the multi-value memory.

18. The memory controller according to claim 14, wherein the non-volatile semiconductor memory is a NAND flash memory, and the memory controller controls the NAND flash memory.

19. The memory controller according to claim 17, wherein the multi-value memory is a NAND flash memory, and the memory controller controls the NAND flash memory.

20. A memory controller which controls a non-volatile semiconductor memory including a memory cell array and an issue timing control section which controls timing of issuing the pseudo pass function, the memory controller comprising:

a function of issuing a writing command to cause data to be written into a plurality of memory cells in the memory cell array; and a function of controlling the issue timing control section.

* * * * *